US008546939B2

(12) United States Patent
Sasaki et al.

(10) Patent No.: US 8,546,939 B2
(45) Date of Patent: Oct. 1, 2013

(54) RF MODULE INCLUDING CONTROL IC WITHOUT THE AID OF A RELAY PAD

(75) Inventors: Kenji Sasaki, Tokyo (JP); Tomonori Tanoue, Tokyo (JP); Sakae Kikuchi, Tokyo (JP); Toshifumi Makino, Tokyo (JP); Takeshi Sato, Tokyo (JP); Tsutomu Kobori, Tokyo (JP); Yasunari Umemoto, Tokyo (JP); Takashi Kitahara, Tokyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1072 days.

(21) Appl. No.: 11/618,207

(22) Filed: Dec. 29, 2006

(65) Prior Publication Data

US 2007/0190962 A1    Aug. 16, 2007

(30) Foreign Application Priority Data

Feb. 15, 2006    (JP) .................. 2006-037931

(51) Int. Cl.
| H01L 23/34 | (2006.01) |
| H01L 29/66 | (2006.01) |
| H01L 23/52 | (2006.01) |
| H01L 23/48 | (2006.01) |
| H01L 29/40 | (2006.01) |
| H03F 1/00 | (2006.01) |
| H03F 3/14 | (2006.01) |
| H03F 3/04 | (2006.01) |
| H03F 3/68 | (2006.01) |
| H04B 1/06 | (2006.01) |
| H04B 7/00 | (2006.01) |
| H04B 1/28 | (2006.01) |

(52) U.S. Cl.
USPC ........... 257/728; 257/197; 257/378; 257/565; 257/691; 257/723; 257/784; 257/E21.695; 257/E21.696; 257/E23.141; 257/E27.015; 330/66; 330/307; 330/310; 455/251.1; 455/333

(58) Field of Classification Search
USPC .................................................. 257/E21.695
See application file for complete search history.

(56) References Cited

U.S. PATENT DOCUMENTS

| 6,008,935 | A | * | 12/1999 | Fujita et al. ................. 359/341.4 |
| 6,078,514 | A | * | 6/2000 | Takemae et al. ................. 365/63 |
| 6,882,044 | B2 | * | 4/2005 | Lemoff et al. ................. 257/723 |
| 6,975,271 | B2 | * | 12/2005 | Adachi et al. .......... 343/700 MS |
| 2004/0125579 | A1 | * | 7/2004 | Konishi et al. ................. 361/783 |
| 2004/0232982 | A1 | * | 11/2004 | Ichitsubo et al. ............. 330/129 |
| 2005/0009484 | A1 | | 1/2005 | Imai et al. |

(Continued)

FOREIGN PATENT DOCUMENTS

| JP | 2005-33350 | 2/2005 |
| JP | 2005-235825 A | 9/2005 |
| JP | 2007-184415 A | 7/2007 |

*Primary Examiner* — Michael Jung
(74) *Attorney, Agent, or Firm* — Mattingly & Malur, PC

(57) ABSTRACT

A technology is provided so that RF modules used for cellular phones etc. can be reduced in size. Over a wiring board constituting an RF module, there are provided a first semiconductor chip in which an amplifier circuit is formed and a second semiconductor chip in which a control circuit for controlling the amplifier circuit is formed. A bonding pad over the second semiconductor chip is connected with a bonding pad over the first semiconductor chip directly by a wire without using a relay pad. In this regard, the bonding pad formed over the first semiconductor chip is not square but rectangular (oblong).

16 Claims, 13 Drawing Sheets

(56) References Cited

U.S. PATENT DOCUMENTS

| | | | |
|---|---|---|---|
| 2005/0030107 A1* | 2/2005 | Shimizu et al. | 330/307 |
| 2005/0180122 A1* | 8/2005 | Okabe | 361/803 |
| 2005/0205986 A1* | 9/2005 | Ichitsubo et al. | 257/690 |
| 2005/0231990 A1* | 10/2005 | Uno et al. | 363/147 |
| 2006/0006432 A1* | 1/2006 | Shiraishi et al. | 257/288 |
| 2006/0166399 A1* | 7/2006 | Ellwood | 438/106 |

* cited by examiner

RF MODULE INCLUDING CONTROL IC WITHOUT THE AID OF A RELAY PAD

CROSS-REFERENCE TO RELATED APPLICATION

The present application claims priority from Japanese patent application No. 2006-37931 filed on Feb. 15, 2006, the content of which is hereby incorporated by reference into this application.

BACKGROUND OF THE INVENTION

The present invention relates to a semiconductor device and its manufacturing technology. In particular, it relates to a technology which can be effectively applied to manufacturing RF (Radio Frequency) modules used for cellular phones etc.

Japanese Unexamined Patent Publication No. 2005-33350 (Patent Reference 1) discloses a technology in which an output terminal (output pad) is formed on one side of the semiconductor chip which constitutes a power amplifier compliant to a dual band, and an input terminal (input pad) is formed on a side intersecting with the side on which the output terminal is formed.

[Patent Reference 1] Japanese Unexamined Patent Publication No. 2005-33350

SUMMARY OF THE INVENTION

For example, there is a semiconductor element which uses III-V group compound semiconductors, such as gallium arsenide (GaAs). Compared with silicon (Si), the degree of movement of a compound semiconductor is greater, and it has a feature in which a semi-insulating crystal can be obtained. Moreover, the compound semiconductor can make a compound crystal and can form heterojunction.

As a semiconductor element which uses the heterojunction, there is a heterojunction-type bipolar transistor (hereafter, called HBT (Heterojunction Bipolar Transistor)). The HBT is a bipolar transistor which uses gallium arsenide for a base layer and uses indium gallium phosphide (InGaP), aluminum gallium arsenide (AlGaAs), etc. for an emitter layer. Namely, the HBT is the bipolar transistor which forms the heterojunction by using different semiconductor materials for the base layer and the emitter layer.

By the heterojunction, a forbidden band gap of the emitter in base-emitter junction can be made larger than that of the base. Therefore, since injection of carriers from the emitter to the base can be made much greater than injection of inverse charge carriers from the base to the emitter, the current gain of the HBT increases considerably.

The HBT is used, for example, for a high frequency amplifier system (RF module) mounted in a cellular phone because the current gain reaches a quite high level as described above. In the RF module, semiconductor chips in which HBTs are formed are mounted on a wiring board.

In recent years, numbers of electronic components are built into communication terminal devices, such as a cellular phone. Among them, the RF module included in a transmitting part of the cellular phone has been rapidly becoming small-sized and highly functional.

The HBT is used for an RF module mounted in a cellular phone, for example, as described above. Such an RF module includes, for example, three stages of amplifier circuits and a control circuit which controls these amplifier circuits. The HBTs are used for the three stages of amplifier circuits. FIG. 6 shows a section of an RF module 36 studied by the present inventors. In FIG. 6, the three stages of amplifier circuits and the control circuit which are included in the RF module 36 are not formed in one semiconductor chip but are formed separately in two semiconductor chips. That is, the three stages of amplifier circuits are formed in a semiconductor chip 28 comprising compound semiconductors, and the control circuit is formed in a semiconductor chip 27 made of silicon. And these semiconductor chips 28 and 27 are mounted on a wiring board 26 two-dimensionally (in a planar state), and are electrically connected by wire bonding with the wiring board 26. Although the semiconductor chip 28 and the semiconductor chips 27 are also connected by a wire at this time, connection of the semiconductor chip 28 and the semiconductor chip 27 is made through a relay pad 37. That is, a bonding pad 38 formed on the semiconductor chip 28 and the relay pad 37 are connected by a wire 39b, and the relay pad 37 and the bonding pad 30 formed on the semiconductor chip 27 are connected by another wire 39a.

However, when connecting the semiconductor chip 28 with the semiconductor chip 27 through the relay pad 37, space in which the relay pad 37 is formed on the wiring board 26 must be secured, and the RF module 36 cannot be reduced in size.

An object of the present invention, therefore, is to provide a technology by which RF modules used for cellular phones etc. can be reduced in size.

The above-stated and other objects and novel features of the present invention will become apparent from the following description in the specification when taken in conjunction with the accompanying drawings.

Typical aspects of the invention disclosed in the present application will be briefly described below.

The semiconductor device of the present invention comprises: (a) a first semiconductor chip in which an amplifier circuit for amplifying an inputted signal and generating an output signal is formed; (b) a second semiconductor chip in which a control circuit for controlling the amplifier circuit is formed; and (c) a wiring board over which the first and second semiconductor chips are arranged adjacent to each other. The first semiconductor chip is electrically connected with the second semiconductor chip by a wire, and the wire directly connects the first semiconductor chip with the second semiconductor chip without the aid of a relay pad.

Further, the semiconductor device of the present invention comprises (a) a first semiconductor chip having two or more first pads; (b) a second semiconductor chip having two or more second pads; (c) a wiring board on which the first semiconductor chip and the second semiconductor chip are mounted; and (d) two or more wires for directly connecting the first pads and the second pads. And either two or more first pads or two or more second pads are rectangular.

Moreover, the method of manufacturing a semiconductor device of the present invention comprises the steps of; (a) arranging, adjacent to each other, a first semiconductor chip in which an amplifier circuit for amplifying an input signal and generating an output signal is formed and a second semiconductor chip in which a control circuit for controlling the amplifier circuit is formed; and (b) directly connecting two or more first pads formed over the first semiconductor chip with two or more second pads formed over the second semiconductor chip by wires, wherein connection by the wires is made from the two or more second pads to the two or more first pads in step (b).

Typical aspects of the invention disclosed in the present application will briefly be described below.

With regard to the first semiconductor chip and the second semiconductor chip which constitute an RF module, the first semiconductor chip in which the amplifier circuit is formed and the second semiconductor chip in which the control circuit controlling the amplifier circuit is formed are directly connected by a wire, without the aid of a relay pad. For this reason, since there is no need to form a relay pad on the wiring board on which the first semiconductor chip and the second semiconductor chip are arranged, the RF module can be reduced in size.

DESCRIPTION OF THE PREFERRED EMBODIMENTS

Figure 1:
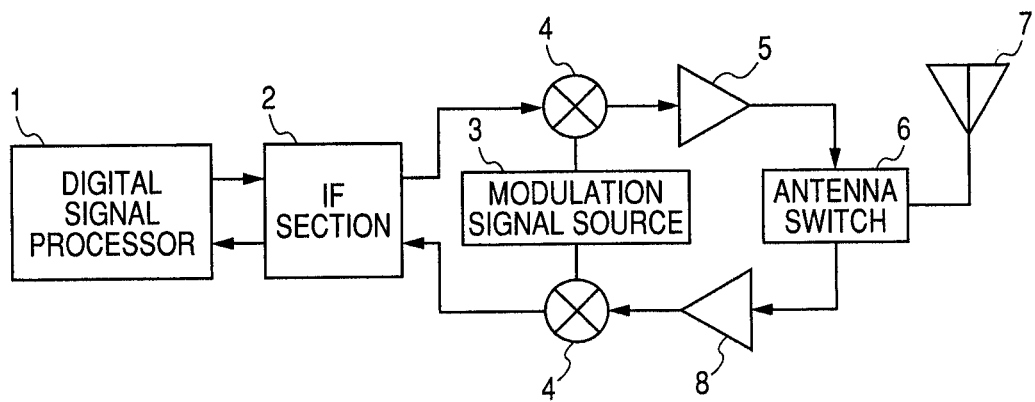
FIG. 1 is a block diagram of a signal transmitter/receiver of a digital cellular phone.

The following embodiment of the invention will be, if necessary, divided into two or more sections or embodiments and explained. However, unless otherwise specified, they are mutually related. They are so related that one is a modification of part or all of the other, or one shows details, supplementary explanations, etc. for the other.

Moreover, in the following embodiments, when referring to the number of elements etc. (including the number of parts, numerical value, quantity, range, etc.), unless otherwise specified or except for the case where it is theoretically and clearly limited to a specific number etc., it is not limited to the specific number and it may be more than or less than the specific number.

It is needless to say, in the following embodiments, that components (including element steps etc.) thereof are not necessarily indispensable unless otherwise specified or except for the cases where they are thought to be theoretically and clearly indispensable.

Similarly, in the following embodiments, when referring to shapes of components etc. and positional relationships etc., unless otherwise specified or except for the case where they are not theoretically and clearly proper, the components substantially similar to or closely resemble such shapes etc. shall be included. This also holds true of the above numerical values and the range.

Moreover, in all the drawings for explaining the embodiments, like reference characters are given to like parts, and repetitive explanations will be omitted.

Now, referring to the drawings, embodiments of the present invention will be explained in detail.

The following embodiments are the ones in which the present invention is applied to an RF module (semiconductor device) mounted in a cellular phone etc., for example.

Embodiment 1

FIG. 1 is a block diagram of a signal transmitter/receiver in a digital cellular phone, for example. In FIG. 1, the signal transmitter/receiver of the cellular phone has a digital signal processor 1, an IF (Intermediate Frequency) section 2, a modulation signal source 3, a mixer 4, an RF module 5, an antenna switch 6, an antenna 7, and a low noise amplifier 8.

The digital signal processor 1 can perform digital processing of analog signals, such as an audio signal, and generates a baseband signal. The IF section 2 can convert the baseband signal generated by the digital signal processor 1 to a signal of an intermediate frequency.

The modulation signal source 3 is a circuit which acquires the modulation signal using a time-base generator, such as a quartz oscillator whose frequency is stable, and the mixer 4 is a frequency converter which converts frequencies.

The RF module 5 is a circuit which newly generates a signal of a strong electric power similar in waveform to a weak input signal by an electric power supplied from a power supply and output it.

The antenna switch 6 is for separating an input signal inputted to the digital cellular phone and an output signal outputted from the digital cellular phone.

The antenna 7 is for transmitting and receiving radio waves, and the low noise amplifier 8 is for amplifying the signal received by the antenna 7.

The digital cellular phone is configured as above, and its operation will be explained briefly below. First, how a signal is transmitted is explained. The baseband signal generated by performing digital processing of analog signals, such as an audio signal, in the digital signal processing 1, is converted to a signal of an intermediate frequency in the IF section 2. Then, the signal of the intermediate frequency is converted to a signal of a radio frequency (RF frequency) by the modulation signal source 3 and the mixer 4. The signal converted to the radio frequency is inputted to the RF module 5. The signal of the radio frequency inputted to the RF module 5 is amplified by the RF module 5, and is transmitted from the antenna 7 through the antenna switch 6.

Next, how a signal is received will be explained. The signal of the radio frequency received by the antenna 7 is amplified by the low noise amplifier 8. Then, the signal amplified by the low noise amplifier 8 is converted to the signal of the intermediate frequency by the modulation signal source 3 and the mixer 4, and is inputted to the IF section 2. In the IF section 2, the signal of the intermediate frequency is detected and a baseband signal is extracted. Then, the baseband signal is processed in the digital signal processor 1, and an audio signal is outputted.

As described above, when a signal is transmitted from the digital cellular phone, the signal is amplified by the RF module 5. Now, a structure of the RF module 5 will be described.

Figure 2:
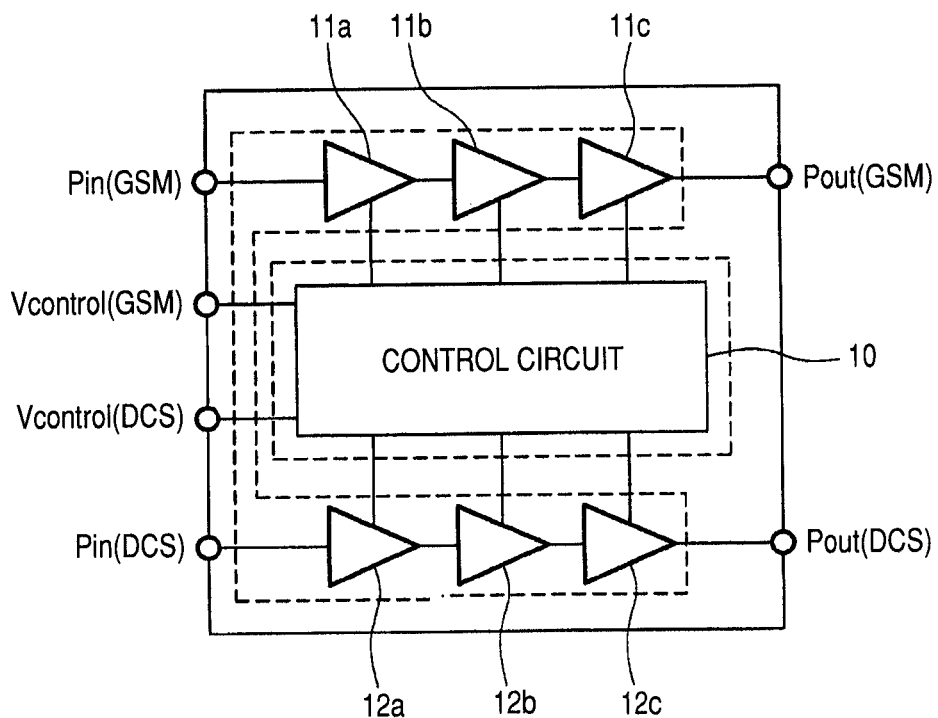
FIG. 2 is a circuit block diagram of a high-frequency amplifier circuit of an RF module.

FIG. 2 shows a circuit block diagram of a high frequency amplifier circuit of an RF module in Embodiment 1. Referring to FIG. 2, the circuit block of the high frequency amplifier circuit will be explained. In FIG. 2, the high frequency amplifier circuit has a control circuit 10, amplifier sections 11a-11c, and amplifier sections 12a-12c. The high frequency amplifier circuit can amplify signals of two kinds of frequency bands. Namely, one is a GSM (Global System for Mobile Communication) system using a first frequency and can amplify the signal which is using 880 MHz-915 MHz as a frequency band. The other is a DCS (Digital Communication System 1800) system using a second frequency and can amplify the signal which is using 1710 MHz-1785 MHz as a frequency band.

The control circuit 10 in the above high frequency amplifier circuit inputs a control signal and, based on the inputted control signal, controls amplifier sections 11a-11c and amplifier sections 12a-12c. The control circuit 10 can input a control signal (V control (GSM)) which controls the amplifier sections 11a-11c, and a control signal (V control (DCS)) which controls the amplifier sections 12a-12c, separately. When using the amplifier sections 11a-11c, control is performed based on the V control (GSM), and when using the amplifier sections 12a-12c, control is performed based on the V control (DCS). Thus, the high frequency amplifier circuit of Embodiment 1 controls amplification of the signals in two kinds of frequency bands. The control circuit 10 comprises a MOSFET (Metal Oxide Semiconductor Field Effect Transistor) etc., for example.

The amplifier sections 11a-11c (first circuit) input the input electric power (input signal) Pin (GSM) of the GSM system, and amplify the input electric power Pin (GSM) over three stages. Namely, first, the input electric power Pin (GSM) is amplified in the amplifier section 11a, and the electric power amplified in the amplifier section 11a is amplified in the amplifier section 11b. The electric power amplified in the amplifier section 11b is then amplified in the amplifier section 11c of the last stage, and outputted as an output signal from a high frequency amplifier circuit. Thus, the electric power according to the GSM system can be amplified in the amplifier sections 11a-11c.

Similarly, the amplifier sections 12a-12c (second circuit) input the input electric power (input signal) Pin (DCS) of the DCS system, and amplify the input electric power Pin (GSM) over three stages. Namely, the input electric power Pin (DCS) is amplified in the amplifier section 12a, and is further amplified in the amplifier section 12b. Then, the electric power amplified in the amplifier section 12b is further amplified in the amplifier section 12c, and is outputted as an output signal from the high frequency amplifier circuit. Thus, the electric power according to the DCS system can be amplified in the amplifier sections 12a-12c.

In this regard, like the amplifier sections 11a-11c described above, the amplifier sections 12a-12c also comprise HBTs with high-level current gains, for example.

The high frequency amplifier circuit constituted in this way is not formed in one semiconductor chip, but is divided and formed in two semiconductor chips. Namely, the amplifier sections 11a-11c and the amplifier sections 12a-12c with relatively high calorific values are formed in the first semiconductor chip mainly comprising a compound semiconductor. The control circuit 10 with a relatively low calorific value is formed in the second semiconductor chip mainly made of silicon.

Next, the control of the amplifier section by the control circuit is explained by using an example for controlling the amplifier section which is the final stage of three-stage amplifier sections.

Figure 3:
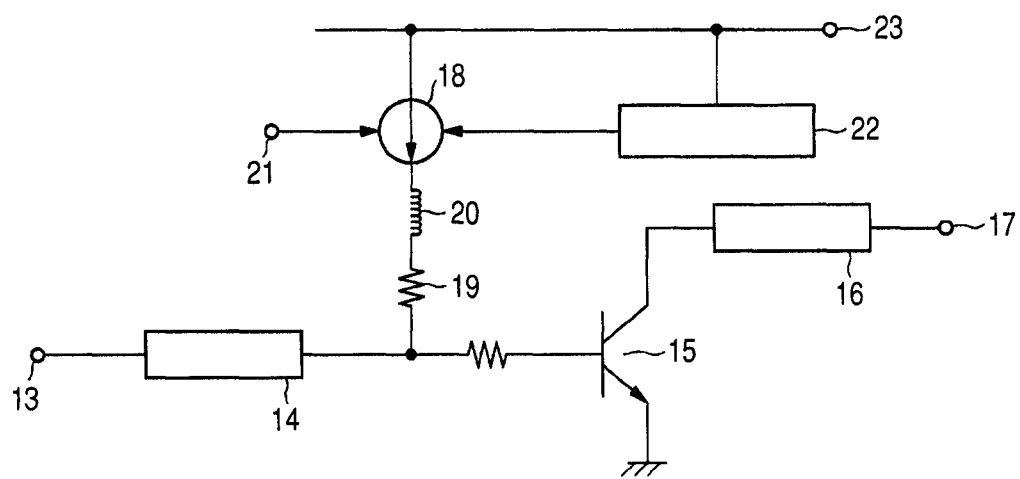
FIG. 3 is a circuit diagram showing part of the amplifier circuit.

FIG. 3 is a circuit diagram showing a circuit configuration of amplifier sections and a control circuit. In FIG. 3, the amplifier section of the final stage has an input terminal 13 for inputting a signal from an amplifier section of the middle stage, and the input terminal 13 is connected to a base electrode of an HBT 15 which has a function of amplifying a signal through a matching circuit 14. An emitter electrode of the HBT 15 is grounded and a collector electrode of the HBT 15 is connected to an output terminal 17 through a matching circuit 16. In the amplifier section of the final stage thus configured, a base current flows between the base electrode and the emitter electrode of the HBT 15 in response to an input signal, and an amplified current flows from the collector electrode to the emitter electrode in response to the base current. Accordingly, the amplified output signal is outputted from the output terminal. In this regard, since the input signal is a high-frequency signal, it is necessary to set an operating point of the HBT 15 to a prescribed position in order to obtain an output signal geometrically similar to a waveform of the input signal. Namely, it is necessary to have the HBT 15 run at idle to allow a constant collector current to flow even when there is no input signal. The operating point of the HBT 15 is determined by an idling current, i.e., a collector current flowing when there is no signal. Therefore, what is necessary is just to set a base current which has a unique relationship with the idling current to a prescribed value to set the operating point of the HBT 15. Because of this, the control circuit to control the amplifier section is needed, and the control circuit allows a prescribed base current (bias current) to flow even when there is not signal in the HBT 15.

For example, the control circuit is configured such that the base current of the HBT 15 is supplied from a current source 18, as shown in FIG. 3. Namely, in the control circuit, the current source 18 is connected to the base electrode of the HBT 15 through a bias resistance 19 and an inductor 20 for blocking high frequencies. An output control terminal 21, a supply voltage detector circuit 22, and a supply voltage terminal 23 are connected to the current source 18, and the supply voltage terminal 23 is connected to the supply voltage detector circuit 22.

The control circuit is configured in this way and the operating point of the HBT 15 is set to a prescribed position by supplying a bias current to the base electrode of the HBT 15 from the current source 18. The amount of the bias current is controlled by an output control voltage applied to the current source 18. When the output control voltage applied to the output control terminal 21 exceeds a prescribed value, the power-supply-voltage detector circuit 22 is activated to limit the output control voltage applied to the current source 18 and to keep the bias current constant. The value of the bias current is set according to the power supply voltage, and becomes smaller as the power supply voltage gets higher.

Figure 4:
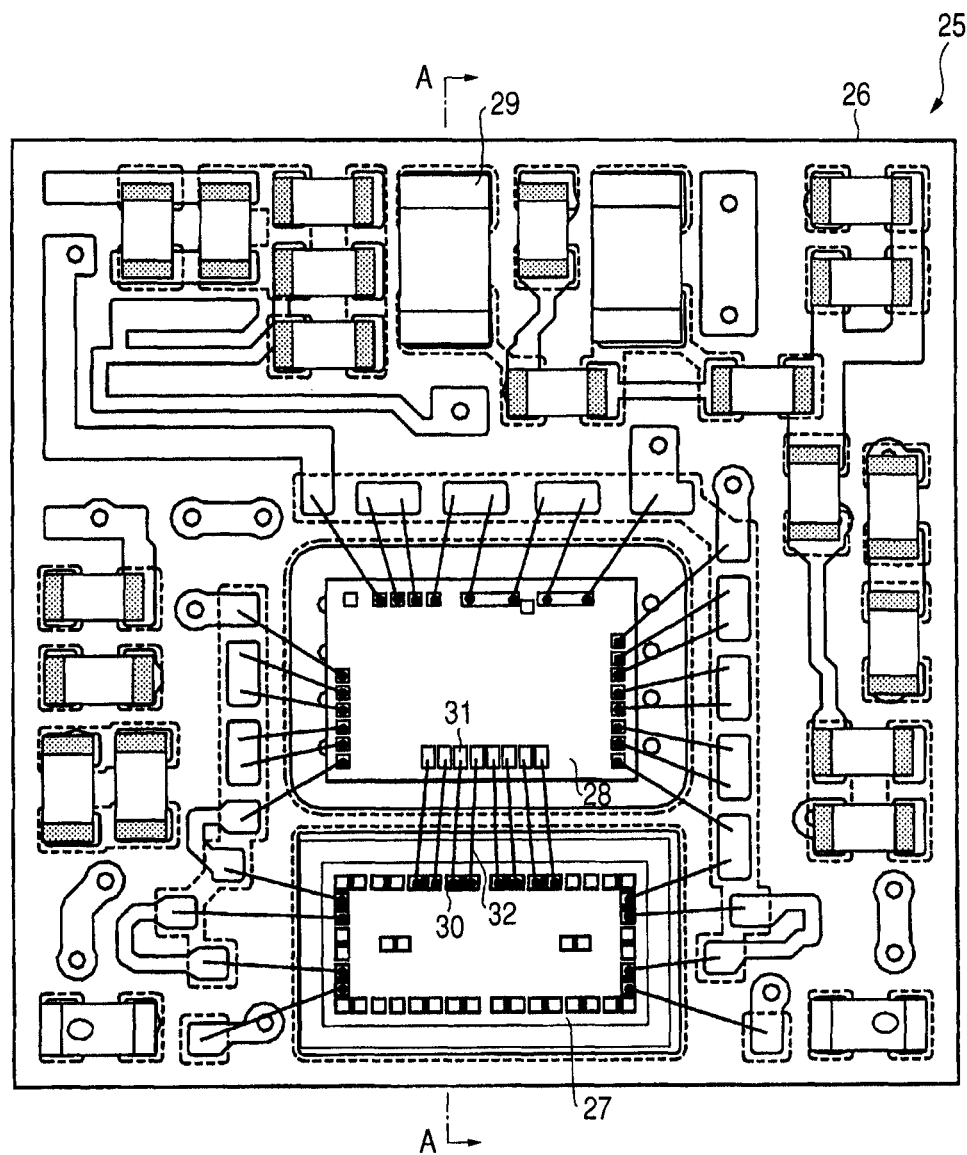
FIG. 4 is a plan view showing a layout of an RF module in Embodiment 1 of the present invention.

Next, the layout of an RF module in Embodiment 1 will be explained. FIG. 4 is a plan view showing a printed circuit board of the RF module of Embodiment 1. As shown in FIG. 4, there are mounted, on a wiring board 26 of the RF module 25 of Embodiment 1, a semiconductor chip (second semiconductor chip) 27, a semiconductor chip (first semiconductor chip) 28, and passive parts 29. The wiring board 26 is a printed-circuit board, for example, and has a structure in which two or more dielectric layers (insulating layers) are stuck with each other. Prescribed wiring is made on a surface (main face), a back face, and inside of the wiring board 26. Also, part of the wiring made on the surface of the wiring board 26 and part of the wiring made on the back face of the wiring board 26 are electrically connected through a via formed in the thickness direction of the wiring board 26.

The semiconductor chip 27 is mainly made of silicon, and a control circuit for controlling an amplifier circuit is formed therein. The control circuit is mainly composed of a MOSFET. The semiconductor chip 27 is rectangular, and two or more bonding pads 30 are formed along its outer circumference. Some of two or more bonding pads 30 are for connection to the semiconductor chip 28. The bonding pads 30 for connection to the semiconductor chip 28 are formed on a side closer to the semiconductor chip 28.

The semiconductor chip 28 is mainly composed of compound semiconductors, such as gallium arsenide (GaAs), and HBTs constituting the amplifier circuit is formed therein. The semiconductor chip 28 is also rectangular, and two or more bonding pads 31 are formed along its outer circumference. The two or more bonding pads 31 are for connection with the semiconductor chip 27, and the bonding pads 31 are formed on the side close to the semiconductor chip 27. The bonding pad 31 is a control pad for electrically connecting to the bonding pad 30 formed over the semiconductor chip 27.

The semiconductor chip 27 in which the control circuit is formed and the semiconductor chip 28 in which the HBT is formed are arranged adjacent to each other. The reason is that, since the control circuit and the amplifier circuit are electrically connected as shown in FIG. 3, it is necessary to electrically connect the semiconductor chip 27 in which the control circuit is formed with the semiconductor chip 28 in which the HBT is formed.

The bonding pad 30 formed over the semiconductor chip 27 and the bonding pad 31 formed over the semiconductor chip 28 are directly connected by a gold wire 32, for example. Thus, one of the features of the present invention is that the bonding pad 30 formed over the semiconductor chip 27 and the bonding pad 31 formed over the semiconductor chip 28 are directly connected by the wire 32. Since it becomes unnecessary to provide a relay pad in space between the semiconductor chip 27 and the semiconductor chip 28 when connecting the bonding pad 30 with the bonding pad 31 directly by the wire 32, the RF module 25 can be reduced in size.

Conventionally, a relay pad is used to connect the semiconductor chip 27 with the semiconductor chip 28. Namely, the bonding pad 30 formed over the semiconductor chip 27 and the relay pad are connected by a wire, and the relay pad and the bonding pad 31 formed on the semiconductor chip 28 are connected by another wire. However, when providing the relay pad between the semiconductor chip 27 and the semiconductor chip 28, it is necessary to provide space in which the relay pad is disposed, which will pose a problem when reducing the RF module in size. So, in Embodiment 1, the bonding pad 30 formed over the semiconductor chip 27 and the bonding pad 31 formed over the semiconductor chip 28 are directly connected by the wire 32. Accordingly, since it becomes unnecessary to secure the space in which a relay pad is disposed between the semiconductor chip 27 and the semiconductor chip 28, the semiconductor chip 27 and the semiconductor chip 28 can be arranged closely adjacent to each other. Therefore, the RF module can be further reduced in size.

The bonding pad 31 formed over the semiconductor chip 28 in Embodiment 1 is arranged on one side close to the semiconductor chip 27. That is, the control pads (bonding pads 31) connected with the semiconductor chip 27 among two or more pads formed over the semiconductor chip 28 are arranged along one side of the semiconductor chip 28. This arrangement is intended to connect the bonding pad 30 with the bonding pad 31 directly by the wire 32 easily. The reason is that the distance between the bonding pad 30 and the bonding pad 31 may vary and it may become difficult to perform wire bonding unless bonding pads 31 are arranged on one side of the semiconductor chip 28. Thus, another one of the features of the present invention is to arrange the bonding pads 31 which are pads for control on one side of the semiconductor chip 28, which makes it easier to connect directly the bonding pad 30 with the bonding pad 31.

Then, the passive parts 29 formed on the wiring board 26 comprise chip parts and, for example, include a resistor, an inductance element, a capacitor, etc. These passive parts 29 are electrically connected with wiring formed over a surface of the wiring board. The passive parts 29 constitute, for example, the matching circuits 14 and 16 shown in FIG. 3.

Figure 5:
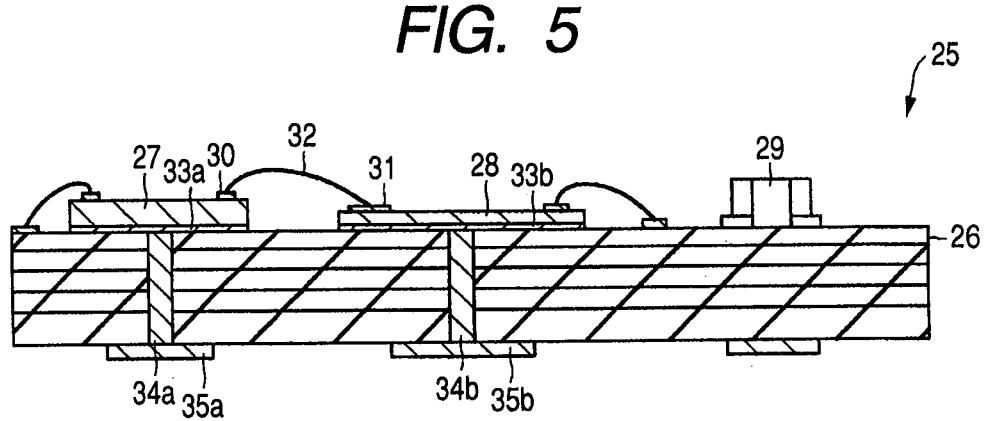
FIG. 5 shows the A-A section of the RF module of FIG. 4.

FIG. 5 shows the A-A section of the RF module of FIG. 4. In FIG. 5, the wiring board 26 is a multi-layer wiring board which comprises five dielectric layers, for example. Although five dielectric layers are laminated to form the wiring board 26 in FIG. 5, the dielectric layers to be laminated are not limited to the above and can be changed variously. As a material for composing the dielectric layer, ceramic materials, such as alumina (aluminum oxide), can be used, for example. The material which constitutes the dielectric layer is not limited to ceramic materials, and can be changed variously. For example, a glass epoxy resin etc. may be used.

The semiconductor chip 27 is mounted on the surface of the wiring board 26 constituted in this way through a conductive adhesive material 33a, and the semiconductor chip 28 is similarly mounted on it through a conductive adhesive material 33b. Further, the passive parts 29 are also mounted. A via 34a which penetrates the wiring board 26 is formed at the bottom of the semiconductor chip 27, and the via 34a is connected to wiring 35a formed over the back of the wiring board 26. Thus, while the wiring 35a can be electrically connected with the semiconductor chip 27 by connecting the wiring 35a with the semiconductor chip 27 by the via 34a, the heat generated in the semiconductor chip 27 is diffused through the via 34a and the wiring 35a. Therefore, the heat dissipation efficiency of the semiconductor chip 27 can be raised. Similarly, the semiconductor chip 28 is also connected to wiring 35b through a via 34b. Further, in FIG. 5, although an example in which one via 34a and one via 34b are formed is shown, the number is not limited to this, and two or more vias may be formed.

The bonding pad 30 formed over the semiconductor chip 27 and the bonding pad 31 formed over the semiconductor chip 28 are directly connected by the wire 32, without using a relay pad. Therefore, since there is no need to secure space for the relay pad, the RF module 25 can be reduced in size.

Figure 6:
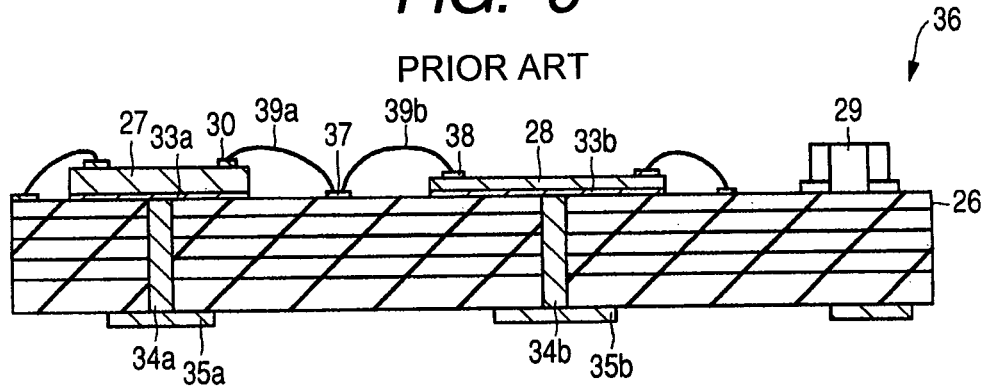
FIG. 6 shows a section of an RF module studied by the present inventors.

FIG. 6 shows a section of an RF module 36 for comparison with the RF module 25 shown in FIG. 5. The point that the RF module 36 shown in FIG. 6 is different from the RF module 25 shown in FIG. 5 is that the semiconductor chip 27 is electrically connected with the semiconductor chip 28 by using a relay pad 37. That is, in FIG. 6, the bonding pad 30 formed over the semiconductor chip 27 and the relay pad 37 are connected by a wire 39a, and the bonding pad 38 formed over the semiconductor chip 28 and the relay pad 37 are connected by a wire 39b. In this case, since space for providing the relay pad over the wiring board 26 must be secured, the RF module 36 shown in FIG. 6 cannot easily be reduced in size compared with the RF module 25 shown in FIG. 5. In other words, compared with the RF module 36 shown in FIG. 6, the RF module 25 in Embodiment 1 shown in FIG. 5 can be reduced in size.

Figure 7:
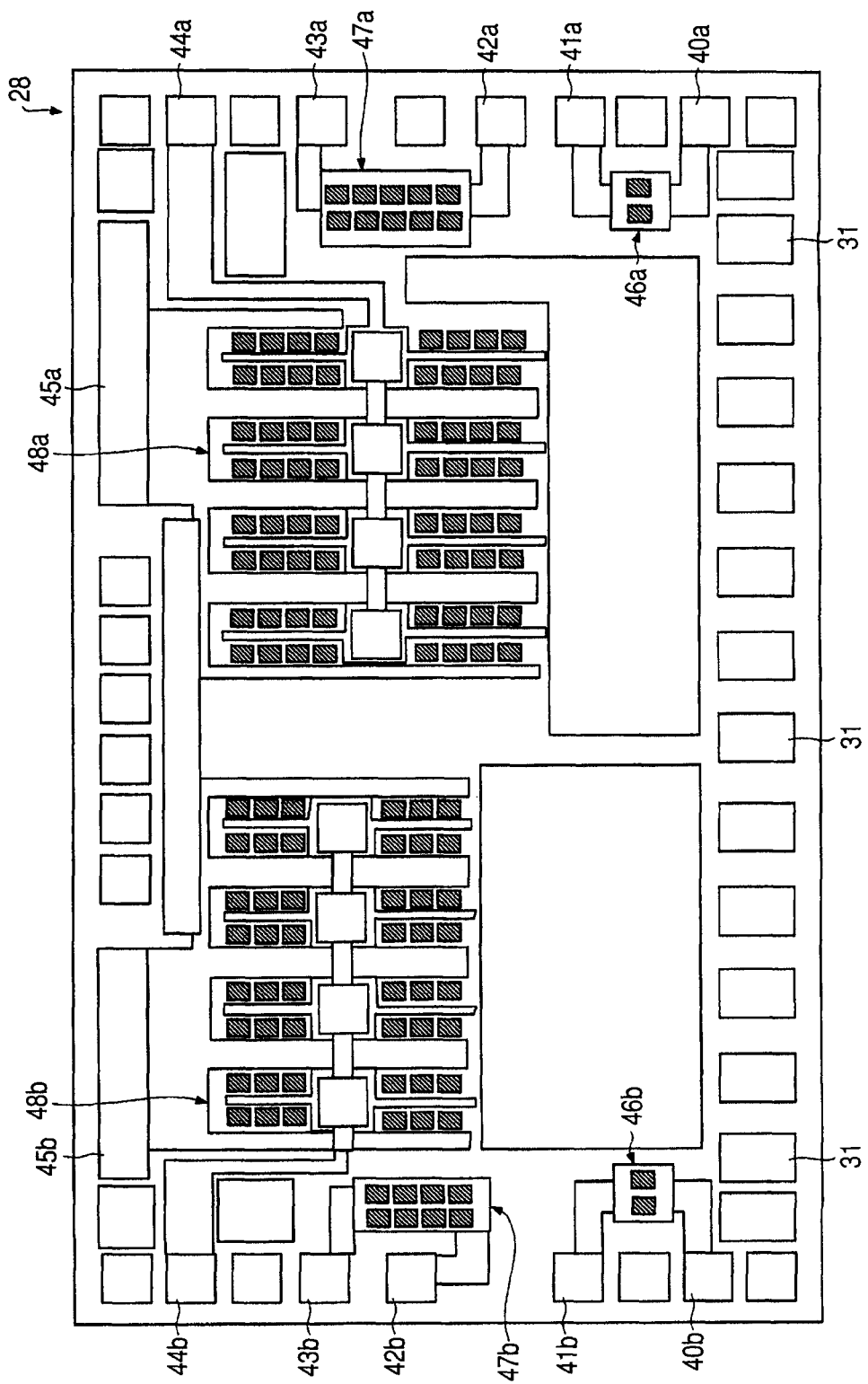
FIG. 7 is a plan view showing a structure of a semiconductor chip in which an amplifier circuit is formed in Embodiment 1.

Next, referring to FIG. 7, a structure of the semiconductor chip 28 will be described. FIG. 7 is a plan view showing the structure of the semiconductor chip 28. In FIG. 7, the three-stage amplifier sections (amplifier circuits) which amplify signals for the GSM system, and the three-stage amplifier sections (amplifier circuits) which amplify signals for the DCS system are provided on the right and left sides of the semiconductor chip 28, respectively, in generally symmetrical manner. The bonding pads 31 which are pads for control are arranged on one of a pair of long sides of the semiconductor chip 28. The bonding pad 31 is a terminal for electrically connecting, by a wire, the semiconductor chip 28 in which the amplifier circuits are formed with the semiconductor chip 27 in which the control circuits are formed. The bonding pad 31 is rectangular, and a tip of a capillary does not contact a surface protection film surrounding the bonding pad 31 during stitch bonding. Accordingly, damage to the surface protection film by the tip of the capillary contacting the surface protection film can be prevented during the stitch bonding.

On a side intersecting, at right angles, with one side of the semiconductor chip 28 over which the bonding pad 31 is formed, an input-and-output pad of the amplifier circuit is formed. To be specific, in a region on the right-hand side of the semiconductor chip 28 in which the amplifier circuit for the GSM system is formed, first, an input pad 40a for inputting an input signal is formed on a side intersecting, at right angles, with the side on which the bonding pad 31 is formed. The input pad 40a is connected to a first amplifier section 46a, and the output of the first amplifier section 46a is connected to a first-stage output pad 41a. A middle-stage input pad 42a is formed adjacent to the first-stage output pad 41a, and the middle-stage input pad 42a is electrically connected to a second amplifier section 47a. The output of the second amplifier section 47a is connected to a middle-stage output pad 43a. A final-stage input pad 44a is formed adjacent to the middle-stage output pad 43a, and the final-stage input pad 44a is connected to a third amplifier section 48a. The output of the third amplifier section 48a is connected to an output pad 45a, and an output signal is outputted from the output pad 45a.

As shown in FIG. 7, the input pad 40a, the first-stage output pad 41a, the middle-stage input pad 42a, the middle-stage output pad 43a, and the final-stage input pad 44a are arranged in this order on the side intersecting, at right angles, with the side on which the bonding pads 31 are formed. Thus, it is one of the features of the present invention to arrange the input pad 40a, the first-stage output pad 41a, the middle-stage input pad 42a, the middle-stage output pad 43a, and the final-stage input pad 44a in a row along one side. Accordingly, signal paths can be prevented from crossing each other. Namely, by arranging these pads along a signal path, interference between signals can be prevented and the reliability of the amplifier circuit can be increased. That is, the signal inputted from the input pad 40a is amplified step by step in the first amplifier section 46a, the second amplifier section 47a, and the third amplifier section 48a, and is outputted as an output signal from the output pad 45a. For this reason, if the input and output of the first amplifier section 46a, the second amplifier section 47a, and the third amplifier section 48a are not arranged along a signal path, signal paths will cross each other. If the signal paths cross each other, interference between signals will take place and the performance of the amplifier circuit will be degraded. So, in Embodiment 1, the interference between signals can be suppressed by arranging the input and output of the first amplifier section 46a, the second amplifier section 47a, and the third amplifier section 48a along one signal path.

Moreover, the output pad 45a connected to the output of the third amplifier section 48a is formed on a side opposing the side on which the bonding pads 31 are formed. The output pad 45a is arranged on the side opposing the side on which the bonding pads 31 are formed in order to secure space for it, since its size is larger than other pads.

Furthermore, the third amplifier section 48a is arranged closer to the center of the semiconductor chip 28 than the first amplifier section 46a and the second amplifier section 47a, and the first amplifier section 46a and the second amplifier section 47a are arranged closer to the input pad 40a than the third amplifier section 48a. Thereby, the distance from the input pad 40a to the first amplifier section 46a and the second amplifier section 47a can be shortened. The input pad 40a is connected to the first amplifier section 46a, and the first amplifier section 46a is connected to the second amplifier section 47a. By arranging the first amplifier section 46a and the second amplifier section 47a close to the input pad 40a, the length of the wiring connecting the input pad 40a with the first amplifier section 46a or the length of the wiring connecting the first amplifier section 46a with the second amplifier section 47a can be shortened. Accordingly, since the length of the wiring provided in the semiconductor chip 28 can be shortened, the semiconductor chip 28 can be reduced in size.

Although the structure of the amplifier circuit for the GSM system has been described above, a structure of the amplifier circuit for the DCS system is also the same. The amplifier circuit for the DCS system is formed in the left-side region of the semiconductor chip 28 shown in FIG. 7. Also in this amplifier circuit, an input-and-output pad of the amplifier circuit is formed on a side intersecting, at right angles, with one side of the semiconductor chip 28 on which the bonding pads 31 are formed. To be specific, in the left-side region of the semiconductor chip 28 in which the amplifier circuit for the DCS system is formed, an input pad 40b for inputting an input signal is first formed on a side intersecting, at aright angles, with the side on which the bonding pads 31 are formed. The input pad 40b is connected to a first amplifier section 46b, and the output of the first amplifier section 46b is connected to a first-stage output pad 41b. A middle-stage input pad 42b is formed adjacent to the first-stage output pad 41b, and the middle-stage input pad 42b is electrically connected to a second amplifier section 47b. The output of the second amplifier section 47b is connected to a middle-stage output pad 43b. Then, a final-stage input pad 44b is formed adjacent to the middle-stage output pad 43b, and a final-stage input pad 44b is connected to a third amplifier section 48b. The output of the third amplifier section 48b is connected to an output pad 45b, and an output signal is outputted from the output pad 45b.

As shown in FIG. 7, the input pad 40b, the first-stage output pad 41b, the middle-stage input pad 42b, the middle-stage output pad 43b, and the final-stage input pad 44b are arranged in this order on the side intersecting, at right angles, with the side on which the bonding pads 31 are formed. Therefore, also in the amplifier circuit for the DCS system, these pads are arranged along a signal path as in the amplifier circuit for the GSM system. Therefore, interference between signals can be prevented and the reliability of the amplifier circuit can be increased.

Further, the output pad 45*b* connected to the output of the third amplifier section 48*b* is formed on a side opposing the side on which the bonding pads 31 are formed.

Furthermore, the third amplifier section 48*b* is arranged closer to the center of the semiconductor chip 28 than the first amplifier section 46*b* and the second amplifier section 47*b*, and the first amplifier section 46*b* and the second amplifier section 47*b* are arranged closer to the input pad 40*b* than the third amplifier section 48*b*. Thereby, since the distance from the input pad 40*b* to the first amplifier section 46*b* and the second amplifier section 47*b* can be shortened, the semiconductor chip 28 can be reduced in size.

Next, the internal structures of the first amplifier sections 46*a* and 46*b*, the second amplifier sections 47*a* and 47*b*, and the third amplifier sections 48*a* and 48*b* will be explained. Elements for amplification are formed inside the first amplifier sections 46*a* and 46*b*, the second amplifier sections 47*a* and 47*b*, and the third amplifier sections 48*a* and 48*b*. According to Embodiment 1, HBTs are formed therein.

Figure 8:
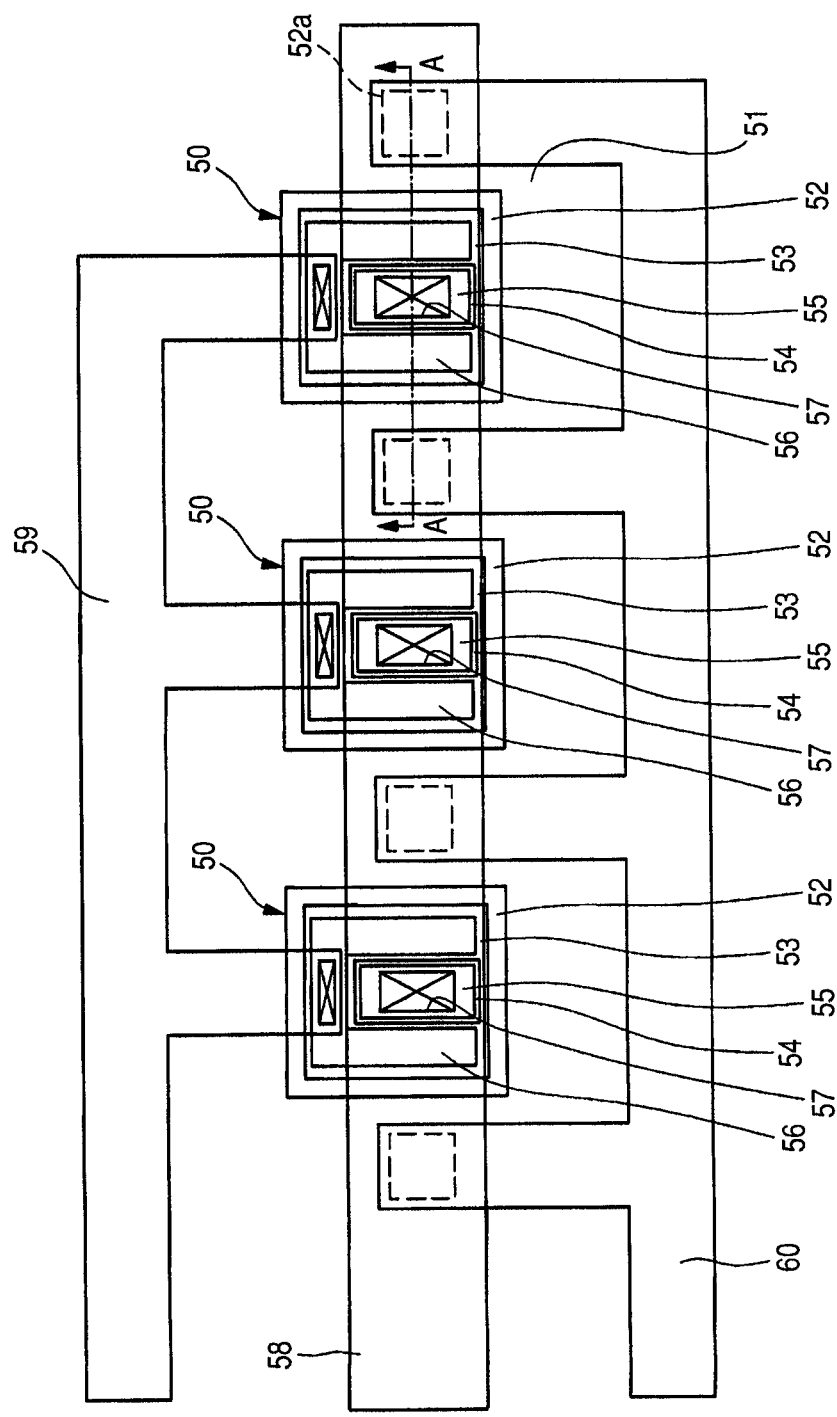
FIG. 8 is a plan view showing HBTs to be used for the amplifier circuit.

FIG. 8 is a plan view showing the layout of HBTs. As shown in FIG. 8, over a sub-collector layer 51 comprising an n+ type GaAs layer which is separated from other elements by mesa isolation, for example, HBTs 50 are formed at prescribed intervals. The HBT 50 has a collector electrode 52*a* formed over the sub-collector layer 51 and a collector mesa 52 which is spaced from the collector electrode 52*a*. The collector electrode 52*a* is made of gold (Au) etc., for example.

The collector mesa 52 is formed from an n type GaAs layer, for example, and the collector mesa 52 and the collector electrode 52*a* are electrically connected through the sub-collector layer 51. And over the collector mesa 52, a base mesa 53 comprising a p type GaAs layer is formed, for example.

A base electrode 56 made of gold etc. is formed in the adjacent space on the base mesa 53. Namely, the U-shape base electrode 56 is disposed such that it is rotated by 90 degrees counterclockwise. And an emitter layer 54 is formed over a substantially central part of the base mesa 53, and an emitter electrode 55 is formed over the emitter layer 54. For example, the emitter layer 54 is formed from a layer which is made by laminating an n type InGaP layer, a GaAs layer, and an InGaAs layer, and the emitter electrode 55 is made of tungsten silicide (WSi), for example.

Thus, between the base mesa (p type GaAs layer) 53 and the emitter layer (n type InGaP layer) 54, hetero-semiconductor junction (heterojunction) is formed. Moreover, the HBT 50 in Embodiment 1 has a structure in which the collector electrode 52*a* is formed in the lowest layer, the emitter electrode 55 is formed in the uppermost layer, and the base electrode 56 is formed in the middle layer.

Over the emitter electrode 55, emitter wiring 58 is formed through a connection hole 57, and base wiring 59 is formed over the base electrode 56. Similarly, collector wiring 60 is formed over the collector electrode 52*a*.

Figure 9:
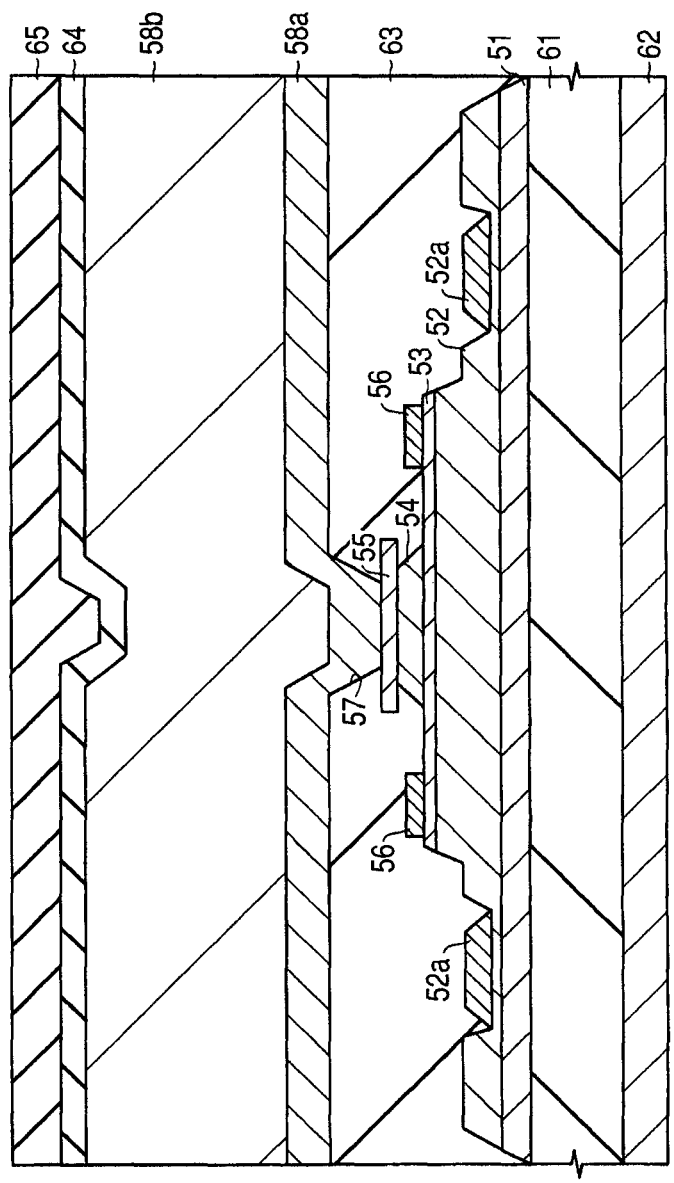
FIG. 9 is the A-A section of the portion shown in FIG. 8.

FIG. 9 is the A-A section of the portion shown in FIG. 8. As shown in FIG. 9, a back electrode 62 which comprises a gold film etc. is formed on the back of the GaAs board 61 of semi-insulation, and an HBT is formed over a surface (main face) of the GaAs board 61. The sub-collector layer 51 is formed over the surface of the GaAs substrate 61, and the collector electrode 52*a* and collector mesa 52 are formed over the sub-collector layer 51. The base mesa 53 is formed on the collector mesa 52 and the base electrode 56 is formed in the vicinity of the base mesa 53. Moreover, the emitter layer 54 is formed in the central part of the base mesa 53, and the emitter electrode 55 is formed over the emitter layer 54. Over the HBT configured in this way, an insulation film 63 which comprises a silicon oxide film is formed, for example. And the connection hole 57 which penetrates the insulation film 63 and reaches the emitter electrode 55 is formed. Over the insulation film 63 including the inside of the connection hole 57, gold wiring 58*a* and gold wiring 58*b* which constitute emitter wiring are formed. Over the gold wiring 58*b*, a surface protection film 64 which is made of silicon nitride is formed, for example, and the a polyimide resin film 65 is formed over the surface protection film 64.

According to the HBT 50 configured in this way, a forbidden band gap of the emitter in a base-emitter junction can be made larger than the forbidden band gap of a base by heterojunction. Therefore, since the injection of carriers from the emitter to the base can be made much greater than the injection of inverse charge carriers from the base to the emitter, the current gain of the HBT 50 increases considerably. For this reason, the HBT 50 is used for the RF module. Further, for example, the amplifier sections 11*a*-11*c* and 12*a*-12*c* shown in FIG. 2 are formed by two or more HBTs shown in FIG. 9 being connected in parallel.

Next, referring to the drawings, a method of manufacturing the semiconductor device of Embodiment 1 will be described.

First, there are formed a semiconductor chip (a first semiconductor chip) 28 in which an amplifier circuit for amplifying an input signal and generating an output signal is formed, and a semiconductor chip (a second semiconductor chip) 27 in which a control circuit for controlling the amplifier circuit is formed. The semiconductor chip 27 is mainly made of silicon, and a MOSFET and wiring are formed over the silicon substrate. On the other hand, the semiconductor chip 28 is mainly composed of compound semiconductors, such as GaAs, for example, and an HBT and wiring are formed on the GaAs substrate. The semiconductor chip 27 and the semiconductor chip 28 are manufactured by a conventional semiconductor manufacturing method. In this regard, compared with the semiconductor chip 27 mainly made of silicon, the semiconductor chip 28 mainly made of GaAs is thinner in many cases. This is because of the following reason. In a step before being turned into pieces, the semiconductor chip 27 and the semiconductor chip 28 are processed in the state of semiconductor wafers. At this time, the semiconductor wafer comprising a silicon substrate of a larger caliber is used in many cases than the semiconductor wafer comprising a GaAs substrate. Therefore, if the semiconductor wafer of the large caliber is made thin, a problem of curvature or a problem in handling such as in conveyance, etc. will arise. For this reason, the semiconductor wafer comprising the silicon substrate with the large caliber cannot be made extremely thin. On the other hand, in many cases, the semiconductor wafer comprising a GaAs substrate does not have a caliber as large as that of the semiconductor wafer comprising a silicon substrate(s). Accordingly, the semiconductor wafer comprising the GaAs substrate can be made thinner than the semiconductor wafer comprising the silicon substrate. Thus, compared with the semiconductor chip 27 mainly made of silicon, the semiconductor chip 28 mainly made of GaAs is thinner in many cases. For example, the thickness of the semiconductor chip 27 is 280 micrometers, and the thickness of the semiconductor chip 28 is 90 micrometers.

Figure 10:
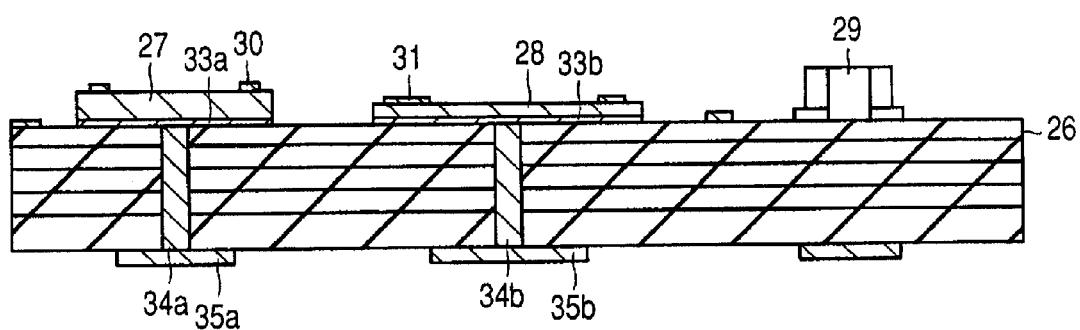
FIG. 10 is a sectional view showing a manufacturing process of the semiconductor device in Embodiment 1.

Next, as shown in FIG. 10, the semiconductor chip 27, the semiconductor chip 28, and the passive parts 29 are mounted on the wiring board 26 (die bonding). At this time, the semiconductor chip 27 and the semiconductor chip 28 are arranged adjacent to each other. The semiconductor chip 27 and the wiring board 26 are connected by using a conductive adhesive material 33*a*, and the semiconductor chip 28 and the wiring board 26 are connected by using a conductive adhesive material 33b. At this time, the semiconductor chip 27 is mounted on a via 34a formed in the wiring board 26 and is electrically connected with wiring 35a in which the semiconductor chip 27 is formed on its back, and the heat generated by the semiconductor chip 27 is made to diffuse from the wiring 35a through the via 34a. Similarly, the semiconductor chip 28 is also connected to the wiring 35b on the back of the wiring board 26 through the via 34b formed in the wiring board 26.

Bonding pads 30 and 31 are formed over the surfaces of the semiconductor chips 27 and 28, respectively. The bonding pad 31 formed over the semiconductor chip 28 is rectangular (oblong) while the bonding pad 30 formed over the semiconductor chip 27 is square. In the present specification, the rectangle means an oblong, among quadrangles, which has short sides and long sides, and a square having sides whose lengths are the same is excluded.

Figure 11:
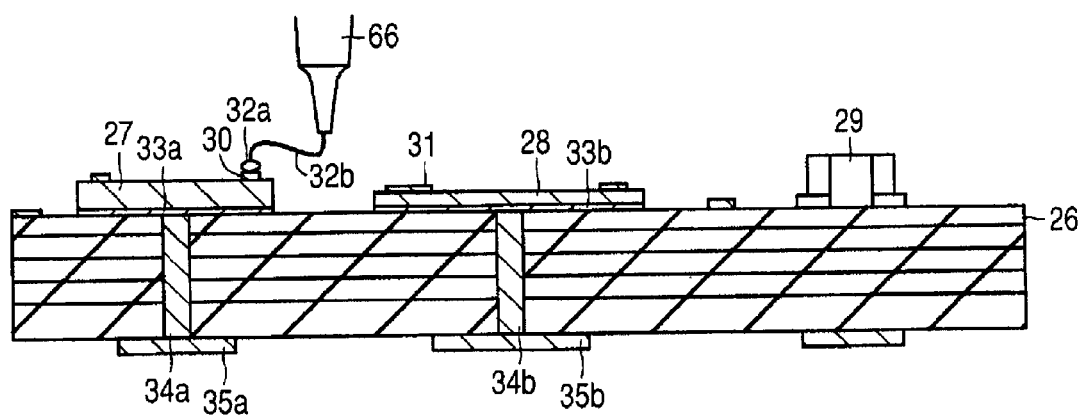
FIG. 11 is a sectional view showing a manufacturing process of the semiconductor device after the process in FIG. 10.

Then, as shown in FIG. 11, the semiconductor chip 27 and the semiconductor chip 28 are directly connected by a wire. Specifically, wire bonding is performed toward the semiconductor chip 28 which is thinner and lower from the semiconductor chip 27 which is thicker and higher. As shown in FIG. 11, on the bonding pad 30 formed over the semiconductor chip 27, a ball 32a is formed by using a capillary 66 (ball bonding, primary bonding). The capillary 66 is moved to the bonding pad 31 formed over the semiconductor chip 28 with the wire 32b being connected to the ball 32a.

Figure 12:
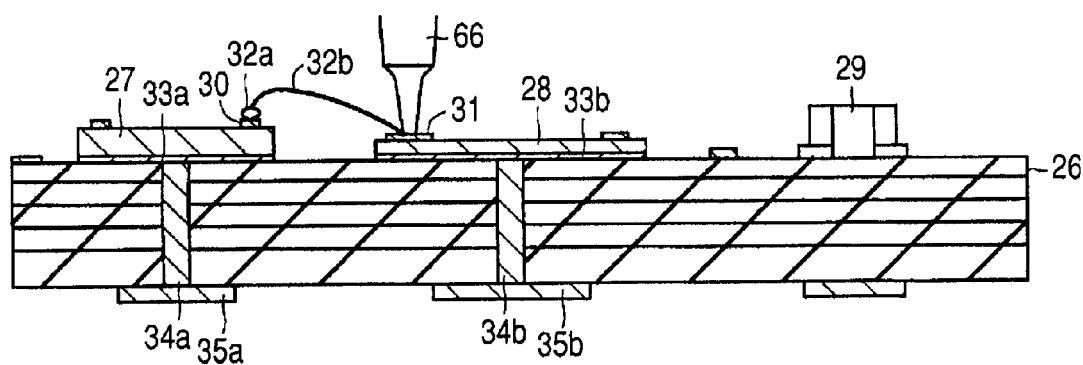
FIG. 12 is a sectional view showing a manufacturing process of the semiconductor device after the process in FIG. 11.

Next, as shown in FIG. 12, the wire 32b is connected to the bonding pad 31 by pressing the capillary 66 against the bonding pad 31 on the semiconductor chip 28 (stitch bonding, secondary bonding). Thus, the semiconductor chip 27 and the semiconductor chip 28 are directly connected. By connecting the semiconductor chip 27 with the semiconductor chip 28, it becomes possible to control an amplifier circuit formed in the semiconductor chip 28 by a control circuit formed in the semiconductor chip 27.

Conventionally, the semiconductor chip 27 and the semiconductor chip 28 are electrically connected through a relay pad. That is, the bonding pad 30 which is formed on the semiconductor chip 27 and the relay pad are connected by a wire, and the bonding pad 31 formed on the semiconductor chip 28 and the relay pad are connected with another wire. In this case, it is necessary to secure space in which the relay pad is placed between the semiconductor chip 27 and the semiconductor chip 28. Accordingly, it has been an obstacle when trying to reduce the RF module in size. So, in Embodiment 1, the semiconductor chip 27 and the semiconductor chip 28 are connected directly, without using the relay pad. It becomes unnecessary, therefore, to secure the space in which the relay pad is placed on the wiring board 26. Thus, according to Embodiment 1, it becomes possible to reduce the interval between the semiconductor chip 27 and the semiconductor chip 28, and the RF module can further be reduced in size.

While there is an advantage of being able to reduce the RF module in size as mentioned above in connecting the semiconductor chip 27 with the semiconductor chip 28 directly, a new problem arises. That is, in wire bonding, ball bonding on a primary side is performed first, and stitch bonding is performed on a secondary side after that. When performing wire bonding of a bonding pad on a semiconductor chip and a connecting terminal on a wiring board, usually, primary bonding is performed at the bonding pad on the semiconductor substrate, and secondary bonding is performed on the wiring board. In this case, since ball bonding is performed in the primary bonding, the tip of a capillary and the bonding pad do not contact and damage is not caused. On the other hand, in the secondary bonding, stitch bonding is performed by pressing the tip of the capillary against the connection terminal of the wiring board. However, it causes no problem even though the capillary is pressed against the connection terminal of the wiring board. That is, when wire-bonding the bonding pad on the semiconductor chip to the connection terminal on the wiring board, it does not cause any problems.

However, when performing wire bonding between the bonding pads on the semiconductor chip like in Embodiment 1, at one of the bonding pads, the capillary is pressed to perform stitch bonding. At this time, the tip of the capillary contacts the surface protection film formed in the vicinity of the bonding pad, which may cause a crack in the surface protection film. If a crack arises in the surface protection film, moisture will infiltrate into the inside of the semiconductor chip through a portion where the crack is made, which will cause a malfunction.

Figure 13:
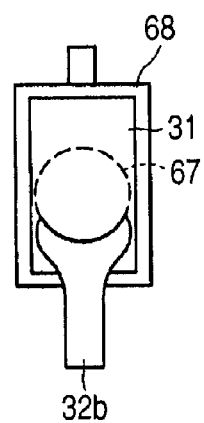
FIG. 13 is a view wherein a bonding pad to which wire bonding is applied in Embodiment 1 is seen from the above.

According to Embodiment 1, as shown in FIG. 13, a bonding pad 31 to which the stitch bonding is applied is rectangular (oblong). FIG. 13 is a view wherein the bonding pad 31 to which wire bonding is applied is seen from the above. In FIG. 13, it is seen that a wire 32b is connected to the bonding pad 31. And a round mark of the dashed line 67 shows a region where the tip of the capillary contacts during the stitch bonding. As shown in FIG. 13, it is seen that since the bonding pad 31 is rectangular the tip of the capillary is contacting inside the bonding pad 31. Namely, it is seen that the tip of the capillary does not jut out of the bonding pad 31, and does not contact the surface protection film 68 formed in the vicinity of the bonding pad 31. For this reason, even if the stitch bonding is performed, the surface protection film 68 formed in the vicinity of the bonding pad 31 is not damaged, and a crack can be prevented from occurring in the surface protection film 68. Therefore, according to Embodiment 1, permeation of moisture through the crack can be prevented and reliability of wire bonding can be increased. The size of the rectangular bonding pad 31 varies according to the capillary to be used. Suppose that the length of a short side is 1 (one), for example. If the length of a long side is set to about 1.5, a satisfactory effect can be obtained. For example, the bonding pad 31 has the short side of 90 micrometers, and the long side of 140 micrometers.

Figure 14:
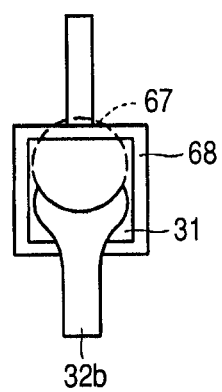
FIG. 14 is a view wherein a bonding pad to which wire bonding is applied according to the technology studied by the present inventors is seen from the above.

FIG. 14 is a view showing a comparison example in which a bonding pad 31 is square as in the conventional case. In FIG. 14 also, a wire 32b is connected on the bonding pad 31 and the dashed line 67 shows a region to which the tip of a capillary contacts. It is seen that the tip of the capillary contacts a surface protection film 68 formed in the vicinity of the bonding pad over the region of the bonding pad 31, as the dashed line 67 shows. This means that the tip of the capillary may contact the surface protection film 68, damage may be caused, and a crack may arise when the bonding pad 31 is square.

Figure 15:
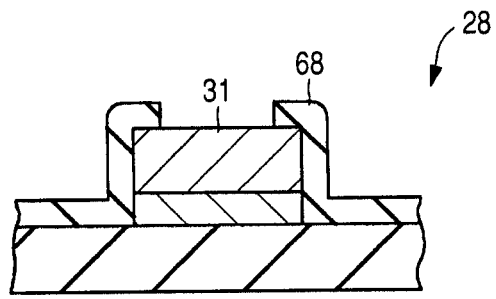
FIG. 15 shows a section of the bonding pad.

FIG. 15 shows a section of the bonding pad 31 formed over the semiconductor chip 28. As shown in FIG. 15, the surface protection film 68 is formed in the vicinity of the bonding pad 31. It is seen that when the contact range of the capillary spreads over the exterior of the bonding pad 31, the tip of the capillary contacts the surface protection film 68.

As the technology to perform wire bonding between bonding pads formed on a semiconductor chip, there is a technology wherein a bump electrode called a stud bump is formed in advance on the bonding pad to which stitch bonding is applied and a wire is stitch-bonded to the stud bump. According to this technology, the damage to the bonding pad during the stitch bonding can be reduced. On the other hand, there is a demerit of another process added because of forming the stud bump.

On the other hand, in Embodiment 1, simply because the bonding pad is rectangular, damage is prevented from being given to the surface protection film in the wire bonding process of connecting bonding pads directly. Namely, according to Embodiment 1, while being able to reduce the RF module in size, reliability in wire bonding between semiconductor chips can be increased.

Next, after the wire bonding, a parts-mounting side of the wiring board 26 is sealed by resin. Then, the wiring board 26 is separated to complete each RF module. Thus, the semiconductor device in Embodiment 1 can be manufactured.

Embodiment 2

Next, Embodiment 2 will be described. In Embodiment 1, as the semiconductor chip 28 constituting the amplifier circuit, the HBT formed on the GaAs substrate is used for the purpose of explanation. In Embodiment 2, description will be made about the case wherein a semiconductor chip in which an amplifier circuit is formed is also mainly made of silicon like the semiconductor chip 27 in which the control circuit is formed, and wherein an LDMOSFET (Laterally Diffused Metal Oxide Semiconductor Field Effect Transistor) is formed instead of an HBT.

Even if the semiconductor in which the LDMOSFET is formed is used as a semiconductor chip in which the amplifier circuit is formed like in Embodiment 2, the RF module can be reduced in size by directly connecting with the semiconductor chip in which the control circuit is formed. In Embodiment 2, since the two semiconductor chips are mainly made of silicon, the thickness of each semiconductor chip is almost the same. Therefore, wire bonding may be performed from the semiconductor chip in which the control circuit is formed to the semiconductor chip in which the amplifier circuit is formed. Alternatively, the wire bonding may be performed from the semiconductor chip in which the amplifier circuit is formed to the semiconductor in which the control circuit is formed. Namely, it serves the purpose if the bonding pad on one of the semiconductor chips in which the control circuit is formed or in which the amplifier circuit is formed is rectangular. However, the rectangular bonding pad is used for the stitch bonding. Accordingly, the semiconductor chips can directly be connected, reducing the RF module in size and suppressing troubles caused by the process of wire bonding.

Figure 16:
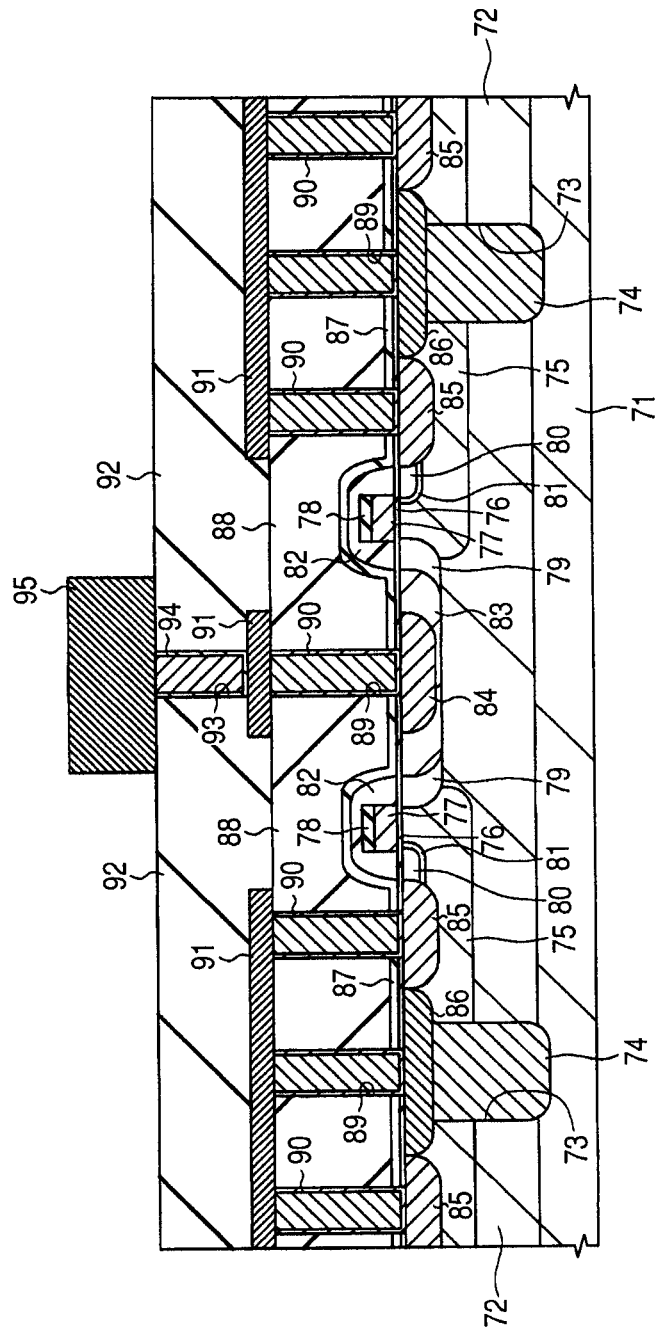
FIG. 16 is a section showing a structure of an LDMOSFET in Embodiment 2.

Now, with regard to the semiconductor chip in which the amplifier circuit is formed, the LDMOSFET constituting the amplifier circuit will be described by referring to the drawings. FIG. 16 is a section showing a structure of the LDMOSFET. In FIG. 16, an epitaxial layer 72 comprising a p− type semiconductor layer is formed over a semiconductor substrate 71 of a p+ type silicon single crystal. In the semiconductor substrate 71, a slot 73 is formed. In the slot 73, for example, a p type polysilicon film is embedded and a p type punch-through layer 74 is formed. Furthermore, a p type well 75 is formed on the surface of the semiconductor board 71.

Next, agate insulation film 76 is formed over the surface of the semiconductor substrate 71, and a gate electrode 77 and a cap insulation film 78 are formed over the gate insulation film 76. The gate insulation film 76 comprises a silicon oxide thin film etc., for example, and the gate electrode 77 comprises a polysilicon film. And while an n− type offset drain region 79 is formed matching the gate electrode 77, an n− type source region 80 is formed. A p type halo region 81 is formed in the vicinity of the n− type source region 80.

Side walls 82 are formed on both sides of the gate electrode 77, and matching with the side walls 82, an n type offset drain region 83 and an n+ type drain region 84 are formed. Similarly, matching the side wall 82, an n+ type source region 85 is formed on the outer side of the n− type source region 80. And a p+ type semiconductor region 86 is formed on the outer side of the n+ type source region 85.

Over the LDMOSFET configured in this way, there is formed an interlayer insulation film comprising a laminated film of a silicon nitride film 87 and an silicon oxide film 88, and a contact hole 89 which penetrates the interlayer insulation film is made. In the contact hole 89, a plug 90 comprising a barrier film and a tungsten film, for example, is embedded.

On the silicon oxide film 88 in which the plug 90 is provided, first-layer wiring 91 comprising an aluminum film, for example, is formed, and an inter layer insulation film comprising a silicon oxide film 92 is formed so that the first-layer wiring 91 may be covered. A connection hole 93 reaching the first-layer wiring 91 is formed in the silicon oxide film 92, and a plug 94 is embedded in the connection hole 93. And second-layer wiring 95 is formed on the silicon oxide film 92 in which the plug 94 is provided. Although other wiring layers and interlayer insulation films may be formed, as required, over the second-layer wiring 95, they are omitted in the present specification. In addition, two or more LDMOSFETs shown in FIG. 16 are connected in parallel, and amplifier sections 11*a*-11*c* and 12*a*-12*c* shown, for example, in FIG. 2 are formed.

Described in Embodiment 2 is the example wherein, in the semiconductor chip in which the amplifier circuit is formed, all of the three-stage amplifier sections constituting the amplifier circuit comprise LDMOSFETs. However, the present invention can be applied to a case where a first stage-amplifier section comprising an LDMOSFET is also formed in a semiconductor chip mainly made of silicon in which a control circuit is formed, for example, and a middle-stage amplifier section and a final-stage amplifier section comprise HBTs formed in a semiconductor chip mainly made of GaAs.

Embodiment 3

In Embodiment 1, the case where the semiconductor chip 27 is mounted without forming a slot called a cavity in the wiring board 26 is explained. In Embodiment 3, however, an example where a cavity 96 is formed in the wiring board 26 and the semiconductor chip 27 is disposed in the cavity 96 will be explained.

Figure 17:
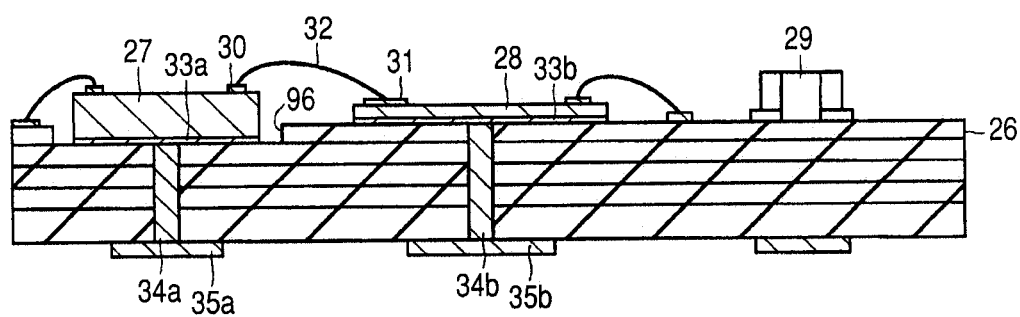
FIG. 17 is a section showing an RF module in Embodiment 3.

FIG. 17 is a section of an RF module in Embodiment 3. The RF module (see FIG. 5) of Embodiment 3 in FIG. 17 is different from the RF module of Embodiment 1 in that the cavity 96 is formed in the wiring board 26 and the semiconductor chip 27 is disposed in the cavity 96. The semiconductor chip 27 is the one in which a control circuit for controlling an amplifier circuit is formed, and is mainly made of silicon. On the other hand, the semiconductor chip 28 is the one in which an amplifier circuit is formed, and is mainly made of GaAs. In this regard, the semiconductor chip 27 mainly made of silicon is thicker than the semiconductor chip 28 mainly made of GaAs in many cases. Therefore, when the semiconductor chip 27 is mounted on the wiring board 26, the cavity 96 is formed in the wiring board 26. By placing the semiconductor chip 27 in the cavity 96, the height of the semiconductor chip 27 mounted on the wiring board 26 can be reduced. Accordingly, the RF module can be made thin and can be reduced in size.

Also in the RF module configured in this way, the semiconductor chip 27 placed in the cavity 96 and the semiconductor chip 28 arranged over the wiring board 26 not having a cavity can directly be connected by a wire 32. Therefore, since there is no need to provide a relay pad like in Embodiment 1, the RF module can be reduced in size.

In FIG. 17, even though the semiconductor chip 27 is placed in the cavity 96, the semiconductor chip 27 is higher than the semiconductor chip 28. Therefore, the wire bonding is performed from the semiconductor chip 27 to the semiconductor chip 28. Namely, ball bonding (primary bonding) is performed at the semiconductor chip 27, and stitch bonding (secondary bonding) is performed at the semiconductor chip 28. Since a bonding pad 31 formed over the semiconductor chip 28 is rectangular, during the stitch bonding, the tip of a capillary does not contact a surface protection film formed in the vicinity of the bonding pad 31, and a crack is prevented from occurring in the surface protection film.

In addition, the cavity 96 may be made deeper than the one shown in FIG. 17, and the semiconductor chip 27 may be made lower than the semiconductor chip 28. In this case, the wire bonding is performed from the semiconductor chip 28 to the semiconductor chip 27. Since the stitch bonding is performed at the bonding pad 30 on the semiconductor chip 27, it serves the purpose if the bonding pad 30 is rectangular in shape.

Embodiment 4

In Embodiment 1, signals of different frequencies are amplified by the semiconductor chip 28 in which the amplifier circuit is formed. Namely, the signal of the GSM system and the signal of the DCS system are amplified in respective amplifier circuits formed in one semiconductor chip 28 (dual band system). In Embodiment 4, an example will be explained in which the amplifier circuit amplifying the signal of the GSM system and the amplifier circuit amplifying the signal of the DCS system are formed in different semiconductor chips.

Figure 18:
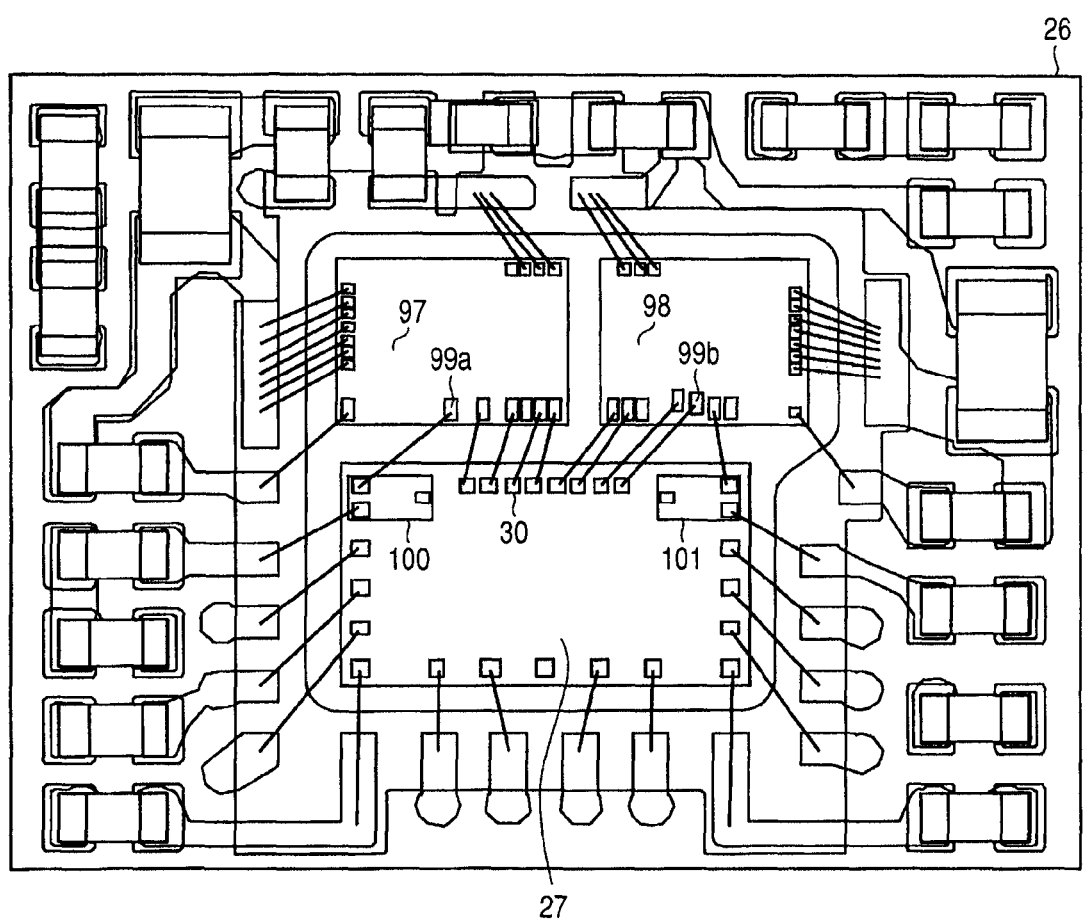
FIG. 18 is a plan view showing an RF module in Embodiment 4.

FIG. 18 is a plan view showing an RF module in Embodiment 4. In FIG. 18, a semiconductor chip 27, a semiconductor chip 97, and a semiconductor chip 98 are mounted on a wiring board 26. A control circuit for controlling an amplifier circuit, a first amplifier section 100 for GSM, and a first amplifier section 101 for DCS are formed on the semiconductor chip 27. The first amplifier section 100 for GSM amplifies the signal of the GSM system and comprises an LDMOSFET, for example. Similarly, the first amplifier section 101 for DCS amplifies the signal of the DCS system and comprises an LDMOSFET, for example.

An amplifier circuit which amplifies the signal of the GSM system is provided in the semiconductor chip 97, which has a second amplifier section for GSM, and a third amplifier section for GSM. The second amplifier section for GSM and the third amplifier section for GSM comprise HBTs.

The amplifier circuit which amplifies the signal of the DCS system is formed in the semiconductor chip 98, which has a second amplifier section for DCS and a third amplifier section for DCS. The second amplifier section for DCS and the third amplifier section for DCS also comprise HBTs.

Also, in the case of the RF module of Embodiment 4 configured in this way, the semiconductor chip 27 and the semiconductor chip 97, or the semiconductor chip 27 and the semiconductor chip 98, are directly connected by a wire. Thus, in the RF module of Embodiment 4, like in Embodiment 1, a relay pad is not used for connection between semiconductor chips. Therefore, the RF module can be reduced in size.

Moreover, the semiconductor chip 27 is mainly made of silicon, and the semiconductor chips 97 and 98 are mainly made of GaAs. For this reason, the semiconductor chip 27 is thicker than the semiconductor chips 97 and 98 in many cases. Therefore, in wire bonding which connects semiconductor chips directly, ball bonding is performed at the semiconductor chip 27 and stitch bonding is performed in the semiconductor chips 97 and 98. Thus, by providing the bonding pads 99a and 99b formed on the semiconductor chips 97 and 98 in the shape of a rectangle, during the stitch bonding, the tip of a capillary is prevented from contacting a surface protection film formed in the vicinity of bonding pads 99a and 99b, and a crack is prevented from occurring in the surface protection film.

The invention made by the present inventors has been specifically described based on the embodiments thereof. However, the present invention is not limited to the above embodiments, and it can be modified variously without departing from the spirit of the invention.

The present invention can be widely utilized in the field of manufacturing semiconductor devices.

What is claimed is:

1. A radio frequency (RF) module including:
   a first semiconductor chip in which an amplifier circuit for amplifying an input RF signal and generating an output RF signal is formed,
   the amplifier circuit comprising a bipolar transistor having a base, an emitter, and a collector,
   the first semiconductor chip having an input pad for inputting the input RF signal, an output pad for outputting the output RF signal, and a first control pad electrically coupled to the amplifier circuit;
   a second semiconductor chip in which a control circuit controlling a base current of the bipolar transistor in the amplifier circuit is formed,
   the second semiconductor chip having a second control pad electrically coupled to the control circuit;
   a wiring board over which the first semiconductor chip and the second semiconductor chip are arranged adjacent to each other,
   the wiring board having a plurality of wirings;
   a control wire bonded to the first control pad of the first semiconductor chip and the second control pad of the second semiconductor chip,
   a control signal of the control circuit controlling the base current being transmitted via the control wire to the bipolar transistor;
   an input wire bonded to the input pad of the first semiconductor chip and coupled to one of the plurality of wirings of the wiring board; and
   an output wire bonded to the output pad of the first semiconductor chip and coupled to another one of the plurality of wirings of the wiring board,
   wherein the input wire overlaps with a first side of the first semiconductor chip in a plan view,
   wherein the output wire overlaps with a second side of the first semiconductor chip in a plan view,
   wherein the control wire directly connects the first control pad of the first semiconductor chip and the second control pad of the second semiconductor chip without the aid of a relay pad, and
   wherein the control wire overlaps with a third side of the first semiconductor chip in a plan view, the third side intersecting the first side and opposing the second side.

2. A radio frequency (RF) module according to claim 1, wherein
   the bipolar transistor of the amplifier circuit is a heterojunction bipolar transistor, and
   the control circuit in the second semiconductor chip comprises a Metal Oxide Semiconductor Field Effect Transistor (MOSFET).

3. A radio frequency (RF) module according to claim 2, wherein
the heterojunction bipolar transistor is formed over a substrate of compound semiconductor, and
the MOSFET is formed over a substrate of silicon.

4. A radio frequency (RF) module according to claim 1, wherein
the amplifier circuit amplifies two or more input signals of different frequency bands, respectively.

5. A radio frequency (RF) module including:
a first semiconductor chip in which an amplifier circuit for amplifying an input RF signal and generating an output RF signal is formed,
the amplifier circuit comprising an input stage bipolar transistor and an output stage bipolar transistor electrically coupled in series each having a base, an emitter, and a collector,
the first semiconductor chip having an input pad electrically coupled to the base of the input stage bipolar transistor, an output pad electrically coupled to the collector of the output stage transistor, and a first control pad electrically coupled to the amplifier circuit,
a second semiconductor chip in which a control circuit controlling a base current of each of the input stage bipolar transistor and the output stage bipolar transistor is formed,
the second semiconductor chip having a second control pad electrically coupled to the control circuit;
a wiring board over which the first semiconductor chip and the second semiconductor chip are arranged adjacent to each other,
the wiring board having a plurality of wirings;
a control wire bonded to the first control pad of the first semiconductor chip and the second control pad of the second semiconductor chip,
a control signal of the control circuit controlling the base current of the input stage bipolar transistor or the output stage bipolar transistor being transmitted via the control wire;
an input wire bonded to the input pad of the first semiconductor chip and coupled to one of the plurality of wirings of the wiring board; and
an output wire bonded to the output pad of the first semiconductor chip and coupled to another one of the plurality of wirings of the wiring board,
wherein the input wire overlaps with a first side of the first semiconductor chip in a plan view,
wherein the output wire overlaps with a second side of the first semiconductor chip in a plan view,
wherein the control wire directly connects the first control pad of the first semiconductor chip and the second control pad of the second semiconductor chip without the aid of a relay pad, and
wherein the control wire overlaps with a third side of the first semiconductor chip in a plan view, the third side intersecting the first side and opposing the second side.

6. A radio frequency (RF) module according to claim 5, wherein
each of the input stage bipolar transistor and the output stage bipolar transistor is a heterojunction bipolar transistor, and
the control circuit in the second semiconductor chip comprises a Metal Oxide Semiconductor Field Effect Transistor (MOSFET).

7. A radio frequency (RF) module according to claim 6, wherein
the heterojunction bipolar transistor is formed over a substrate of compound semiconductor, and
the MOSFET is formed over a substrate of silicon.

8. A radio frequency (RF) module according to claim 5, wherein
the amplifier circuit amplifies two or more input signals of different frequency bands, respectively.

9. A radio frequency (RF) module including:
a first semiconductor chip in which an amplifier circuit for amplifying an input RF signal and generating an output RF signal is formed,
the amplifier circuit comprising a bipolar transistor having a base, an emitter, and a collector,
the first semiconductor chip having a first bonding pad electrically coupled to the amplifier circuit, a second bonding pad for inputting the input RF signal, and a third bonding pad for outputting the output RF signal;
a second semiconductor chip in which a control circuit controlling a base current of the bipolar transistor in the amplifier circuit is formed,
the second semiconductor chip having a fourth bonding pad electrically coupled to the control circuit;
a wiring board over which the first semiconductor chip and the second semiconductor chip are arranged adjacent to each other,
the wiring board having a plurality of wirings;
a first bonding wire bonded to the first bonding pad of the first semiconductor chip and the fourth bonding pad of the second semiconductor chip;
a second bonding wire bonded to the second bonding pad of the first semiconductor chip and coupled to one of the plurality of wirings of the wiring board; and
a third bonding wire bonded to the third bonding pad of the first semiconductor chip and coupled to another one of the plurality of wirings of the wiring board,
wherein the second bonding wire overlaps with a first side of the first semiconductor chip in a plan view,
wherein the third bonding wire overlaps with a second side of the first semiconductor chip in a plan view,
wherein the first bonding wire directly connects the first bonding pad of the first semiconductor chip and the fourth bonding pad of the second semiconductor chip with the aid of a relay pad, and
wherein the first bonding wire overlaps with a third side of the first semiconductor chip in a plan view, the third side intersecting the first side and opposing the second side.

10. A radio frequency (RF) module according to claim 9, wherein
the bipolar transistor of the amplifier circuit is a heterojunction bipolar transistor, and
the control circuit in the second semiconductor chip comprises a Metal Oxide Semiconductor Field Effect Transistor (MOSFET).

11. A radio frequency (RF) module according to claim 10, wherein
the heterojunction bipolar transistor is formed over a substrate of compound semiconductor, and
the MOSFET is formed over a substrate of silicon.

12. A radio frequency (RF) module according to claim 9, wherein
the amplifier circuit amplifies two or more input signals of different frequency bands, respectively.

13. A radio frequency (RF) module including:
a first semiconductor chip in which an amplifier circuit for amplifying an input RF signal and generating an output RF signal is formed,
the amplifier circuit comprising an input stage bipolar transistor and an output stage bipolar transistor electrically coupled in series each having a base, an emitter, and a collector,
the first semiconductor chip having a first bonding pad electrically coupled to the amplifier circuit, a second bonding pad electrically coupled to the base of the input stage bipolar transistor, and a third bonding pad electrically coupled to the collector of the output stage transistor;
a second semiconductor chip in which a control circuit controlling a base current of each of the input stage bipolar transistor and the output stage bipolar transistor is formed,
the second semiconductor chip having a fourth bonding pad electrically coupled to the control circuit;
a wiring board over which the first semiconductor chip and the second semiconductor chip are arranged adjacent to each other,
the wiring board having a plurality of wirings;
a first bonding wire bonded to the first bonding pad of the first semiconductor chip and the fourth bonding pad of the second semiconductor chip,
a control signal of the control circuit controlling the base current of the input stage bipolar transistor or the output stage bipolar transistor and being transmitted via the first bonding wire;
a second bonding wire bonded to the second bonding pad of the first semiconductor chip and coupled to one of the plurality of wirings of the wiring board; and
a third bonding wire bonded to the third bonding pad of the first semiconductor chip and coupled to another one of the plurality of wirings of the wiring board,
wherein the second bonding wire overlaps with a first side to the first semiconductor chip in a plan view,
wherein the third bonding wire overlaps with a second side of the first semiconductor chip in a plan view,
wherein the first bonding wire directly connects the first bonding pad of the first semiconductor chip and the fourth bonding pad of the second semiconductor chip without the aid of a relay pad, and
wherein the first bonding wire overlaps with a third side of the first semiconductor chip in a plan view, and the third side intersecting the first side and opposing the second side.

14. A radio frequency (RF) module according to claim 13, wherein
each of the input stage bipolar transistor and the output stage bipolar transistor is a heterojunction bipolar transistor, and
the control circuit in the second semiconductor chip comprises a Metal Oxide Semiconductor Field Effect Transistor (MOSFET).

15. A radio frequency (RF) module according to claim 14, wherein
the heterojunction bipolar transistor is formed over a substrate of compound semiconductor, and
the MOSFET is formed over a substrate of silicon.

16. A radio frequency (RF) module according to claim 13, wherein
the amplifier circuit amplifies two or more input signals of different frequency bands, respectively.

* * * * *